United States Patent [19]

Schenk

[11] Patent Number: 4,933,891
[45] Date of Patent: Jun. 12, 1990

[54] METHOD AND CIRCUIT CONFIGURATION FOR GENERATING FILTER COEFFICIENTS

[75] Inventor: Heinrich Schenk, Munich, Fed. Rep. of Germany

[73] Assignee: Siemens Aktiengesellschaft, Berlin and Munich, Fed. Rep. of Germany

[21] Appl. No.: 250,883

[22] Filed: Sep. 29, 1988

[30] Foreign Application Priority Data

Sep. 30, 1987 [DE] Fed. Rep. of Germany ....... 3733043

[51] Int. Cl.$^5$ .............................................. G06F 7/38
[52] U.S. Cl. ......................... 364/724.16; 364/724.13; 364/724.19
[58] Field of Search ..................... 364/724.16, 724.13, 364/724.19, 724.2, 750.5

[56] References Cited

U.S. PATENT DOCUMENTS

| | | | |
|---|---|---|---|
| 4,007,341 | 2/1977 | Sourgens et al. | 364/724.16 |
| 4,121,296 | 10/1978 | Snijders et al. | 364/724.16 |
| 4,524,424 | 6/1985 | White | 364/724.16 |
| 4,701,873 | 10/1987 | Schenk | 364/724.16 |
| 4,736,414 | 4/1988 | Montagna et al. | 364/724.16 |

OTHER PUBLICATIONS

Haass, "Basisbanduebertragungseinheit UEB 12-02 Fuer Zweidrehtleitungen", TELCOM Report 2, (1979), No. 6, pp. 413–417.

*Primary Examiner*—David H. Malzahn
*Attorney, Agent, or Firm*—Jeffrey P. Morris; David N. Caracappa

[57] ABSTRACT

Coefficient signals are generated for a transverse filter which receives data signals assuming W different amplitude values as input signals, with N successive input signals being stored in a serial-in-parallel-out (SIPO) storage arrangement having N storage cells. According to the input signals stored in the storage cells of the SIPO storage arrangement, predetermined filter signal coefficients possible for the W possible amplitude values individually are added and W corresponding partial sum signals made available. The partial sum signals are each multiplied by a factor corresponding to the particular amplitude value and subsequently added to form a sum signal. At least some of the product signals are multiplied by an additional correction signal coefficient assigned to the particular amplitude value. The additional product signals resulting therefrom are included in the formation of the sum signal.

10 Claims, 2 Drawing Sheets

METHOD AND CIRCUIT CONFIGURATION FOR GENERATING FILTER COEFFICIENTS

The invention relates to a method and a circuit configuration for generating coefficients in a transversal filter to which data signals assuming W different amplitude values, possibly including asymmetries, are supplied as input signals.

In duplex transmission of data signals in congruent band mode via two-wire lines, signal transmission devices are provided which have at their disposal a transmitting device and a receiving device. During the output of data signals by the transmitting device to the two-wire line, so-called echo signals, related to the transmitted signal, occur in the associated receiving device which are superimposed on the actually received data signals. These echo signals, however, can be considerably greater in amplitude than the received data signals. For compensating such echo signals, an echo compensator is provided which generates correction signals corresponding to the echo signals. These correction signals are subtracted from the signal mixture consisting of echo signals and the actually received data signals.

For generating correction signals, circuit arrangements of the type including transversal filters are customarily used. In known designs of transversal filters which may provide echo signal compensation for the transmission of data signals which can assume a plurality of different amplitude values, as described, for example, in the Journal "Telcom Report", 2 (1979), No. 6, pages 413 to 417, N successive data signals are stored in a serial-in-parallel-out (SIPO) storage arrangement. The amplitude values of the data signals stored in this SIPO storage arrangement are multiplied by respective correction signal coefficients, with the aid of a multiplier, within a time period corresponding to the transmission rate of the data signals. The resulting product signals are subsequently combined to form a sum signal. This sum signal represents a correction signal with which an echo signal occurring in the receiving device of a signal transmission device is compensated. When using a single multiplier, thus, in a time period corresponding to the transmission rate of the data signals as a function of the number of successive data signals to be taken into consideration for the formation of a correction signal, potentially a large number of multiplications need to be carried out in succession. For example, at a data signal transmission rate of 80 kBaud and an inclusion of 48 successive data signals into the formation of a correction signals within a time interval of 12.5 $\mu$s, 48 successive multiplication would be required within the time interval of 12.5 $\mu$s. This can lead to problems of time, depending on the realization of the particular multiplier, especially if still greater transmission rates are wanted for the transmission of data signals.

A digital signal processing arrangement is already known for the generation of digital output signal values (U.S. Pat. No. 4,121,296 issued Oct. 17, 1973 to Snijders et al.). In this arrangement, according to input signal values x(n) stored in a storage arrangement, which input signal values may assume amplitudes 0, +—A1, +—A2, ...+—AM; respective predetermined coefficients for the M possible amplitude values are, in each time period, multiplied by the sign of the amplitude value added, and the M corresponding partial sum signals are made available. The partial sum signals are subsequently multiplied by a factor corresponding to the particular amplitude value and the product signals resulting therefrom added to form a sum signal. With this known arrangement only output signals corresponding to symmetrical input signals can be generated.

It is the task of the present invention to indicate a way by which, in a method and a circuit configuration of the initially mentioned kind, asymmetries in the input signals can be taken into consideration in the formation of the filter signals.

In accordance with principles of the present invention a method is provided for generating filter coefficient signals in a transversal filter. Data signals assuming W different amplitude values are supplied to the filter as input signals. The transversal filter is one: in which, in a SIPO storage arrangement having N storage cells, N successive input signals are stored; in which predetermined filter coefficients, corresponding to the input signals stored in the storage cells of the SIPO storage arrangement are added for the W possible amplitude values, and W corresponding partial sum signals are made available; in which the partial sum signals, subsequently, are multiplied by a factor corresponding to the particular amplitude value; and in which the product signals resulting therefrom are added up to form a sum signal. The method comprises the following steps. Multiplying at least some of the product signals by an additional filter signal coefficient assigned to the particular amplitude value to form additional product signals. And including the additional product signals resulting therefrom in the formation of the sum signal.

The invention carries with it the advantage that, with an overall lesser number of method steps, filter coefficients for input signals can be formed whose possible amplitude levels deviate at least partially by asymmetries from predetermined amplitude values. Thus, within a time period corresponding to the transmission rate of the data signals, only that number of multiplications need be carried out corresponding to the number of possible amplitude levels and the number of the amplitude values deviating through asymmetries from a predetermined nominal value. Such asymmetries in the input signals can be brought about, for example, in particular in the case of multilevel signals, by structural element tolerances in the circuit configuration preceding the filter arrangement.

In accordance with an aspect of the present invention, through an adaptive setting of additional correction signal coefficients provided for considering asymmetries in the input signals, the filter arrangement adapts to different asymmetries. Thus, it is possible, for example, to generate filter coefficients in the transmission of multilevel digital signals in order to compensate for asymmetric echo signals generated by a signal transmission device.

Also in accordance with principles of the present invention, a circuit configuration generates correction signals for suppressing echo signals occurring together with received data signals or for correction of distortion of received data signals. The circuit includes a transversal filter responsive to a transmission of data signals which may assume W different amplitude values. A SIPO storage arrangement having N storage cells stores N successive data signals. A coefficient storage arrangement stores correction signal coefficients assigned to the N storage cells. An accumulator arrangement has a number of accumulators corresponding to the possible W amplitude values of the data signals, which, according to the data signals stored in the storage cells of the SIPO storage arrangement, add only the correction signal coefficients possible for the particular amplitude value and make available a corresponding partial sum signal. A multiplier, coupled to each of the accumulators, multiplies the partial sum signal supplied to it by a factor corresponding to the particular amplitude value and makes available a product signal resulting therefrom. An adder, responsive to the product signals made available by the individual multipliers, adds these and makes available a corresponding sum signal. The circuit further comprises a plurality of further multipliers, succeeding at least some of the multipliers, for multiplying the product signal output by the associated preceding multiplier by an additional correction signal coefficient assigned to the particular amplitude value. The additional product signals made available by the further multipliers are supplied additionally to the adder for the formation of the sum signal.

The advantage of this circuit configuration consists in that, for the generation of correction signals, only a relatively moderate degree of circuit complexity is required.

Below, the invention is explained in greater detail by example in conjunction with drawings.

Figure 1:
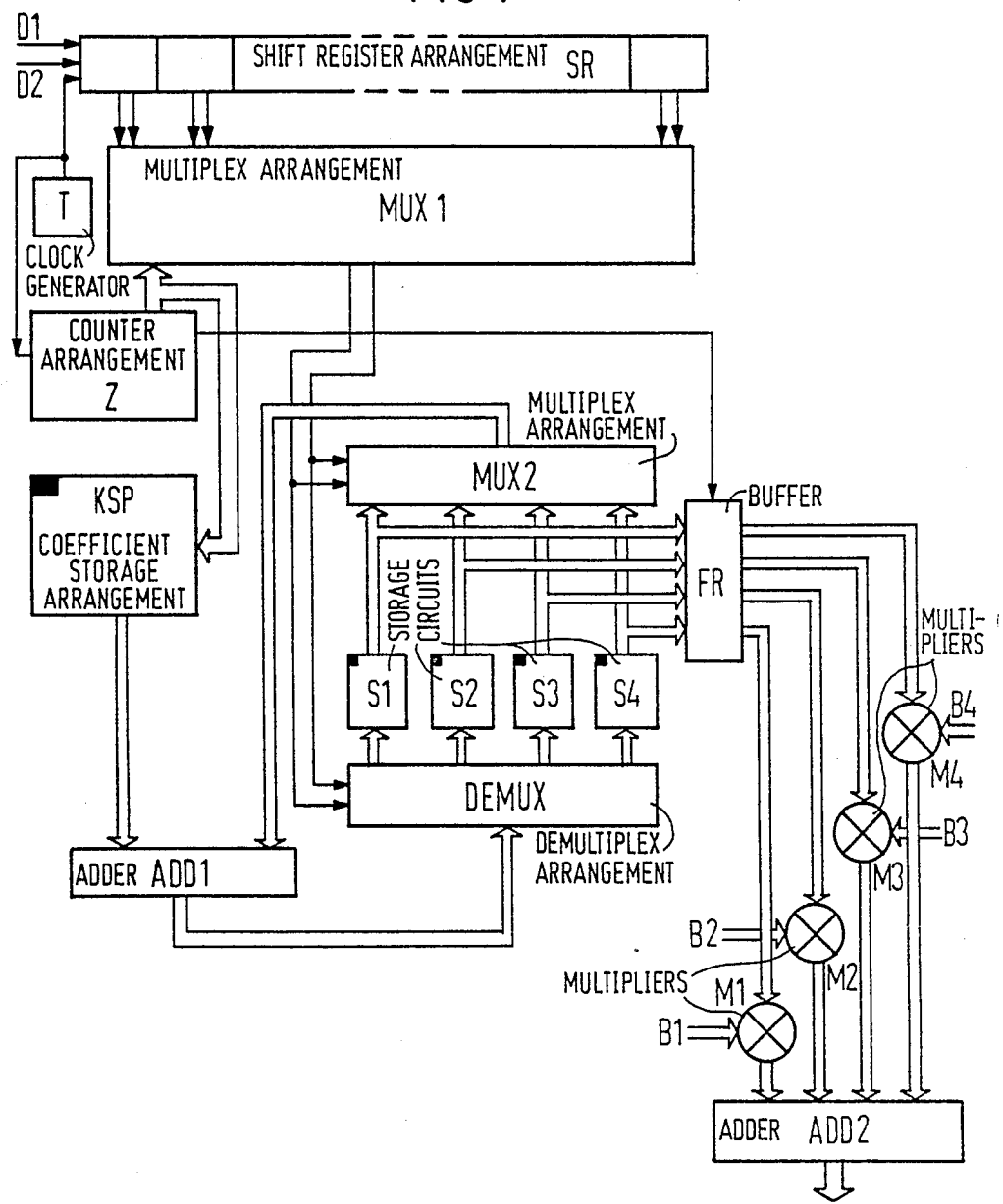
FIG. 1 is a circuit block diagram of a circuit configuration according to the present invention.
Figure 2:
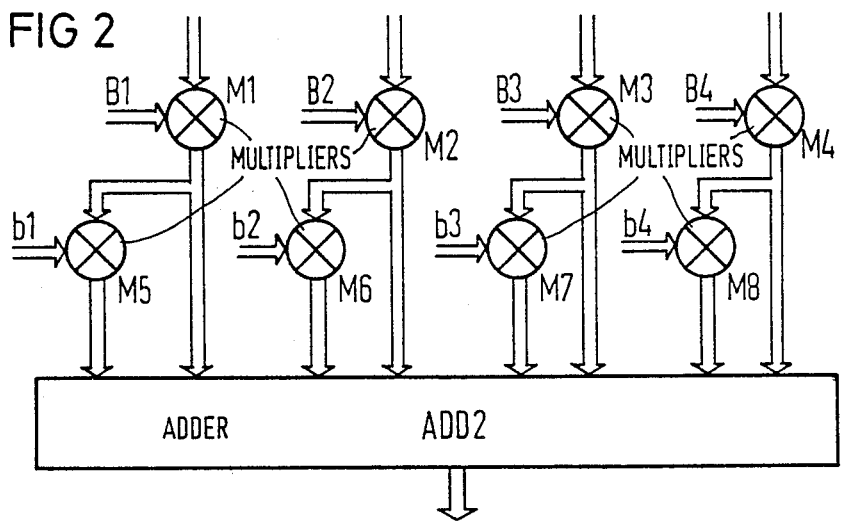
FIG. 2 is a more detailed circuit block diagram illustrating an expansion of the circuit configuration shown in FIG. 1 for generating correction signals functioning for compensating asymmetrical echo signals.
Figure 3:
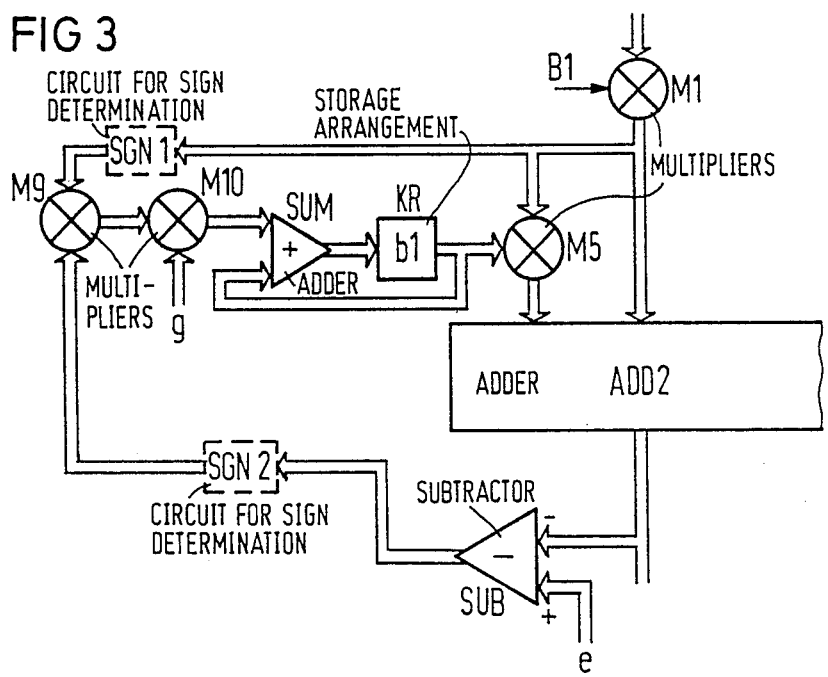
FIG. 3 is a circuit block diagram showing details of a circuit configuration which can be applied for an adaptive setting of correction signal coefficients.

In FIGS. 1, 2 and 3 thick lines represent multibit digital signal paths, and thin lines represent single bit digital signal paths or clock signal paths. FIG. 1 illustrates an exemplary circuit configuration for generating correction signals for the transmission of multilevel digital signals. The multilevel digital signals can be assumed to be, for example, four-level digital signals encoded according to a so-called "2B1Q" code which are to be transmitted at a transmission rate of 80 kBaud. Such digital signals can assume four different amplitude values $-3$, $-1$, $+1$ and $+3$.

In FIG. 1, these four-level digital signals are supplied in binary encoded form to the circuit configuration shown in FIG. 1, i.e. each of the amplitude values to be transmitted is represented by two bits. For example, one bit (D1) indicates the amplitude (e.g. a logical "1" corresponds to an amplitude of 3 and a logical "0" corresponds to an amplitude of 1) and the remaining bit (D2) indicates the sign (e.g. a logical "1" corresponds to a negative amplitude value, and a logical "0" corresponds to a positive amplitude value.)

These binary encoded data signals (D1, D2) are supplied to a shift register arrangement SR which receives in parallel at its input terminal the two bits indicating the discrete amplitude values of the data signals. This shift register arrangement, which is also supplied by a clock generator T with 80 kHz clock pulses corresponding to the intended transmission rate, may, be assumed to have, for example, 48 stages. Thus, for the formation of a correction signal, 48 successive data signals are taken into consideration.

Each of the stages of the shift register arrangement SR has two parallel output terminals carrying the two bits indicating an amplitude value. The two output terminals of all of the stages are coupled to respective two-bit input terminals of a multiplex arrangement MUX1. Thus, the multiplex arrangement MUX1 has, overall, 48 input terminals, each carrying two bits. This multiplex arrangement MUX1 also includes control input terminals coupled through a six-bit parallel signal path to a counter arrangement Z. Counter arrangement Z is a free-running count-to-48 binary counter arrangement whose counter count is supplied via the mentioned six-bit parallel signal path as an address control signal to the multiplex arrangement MUX1. The frequency of the counter is, in the present embodiment, 48×80 kHz=3.84 MHz. Corresponding to these continuously available address signals, the amplitude values which are binary coded in the respective stages of the shift register arrangement SR are made available in a time division multiplex manner at an output terminal of the multiplex arrangement MUX1.

The mentioned six-bit parallel signal path is also coupled to address input terminals of a coefficient storage arrangement KSP including a total of 48 storage cells. In these storage cells are stored correction signal coefficients assigned to the individual stages of the shift register arrangement SR, which may, for example, comprise 20 bits. The output terminal of this coefficient storage arrangement is connected to an input terminal of an adder ADD1. A second input terminal of this adder is connected to an output terminal of a further multiplex arrangement MUX2. Multiplex arrangement MUX2 has four input terminals coupled to respective output terminals of corresponding partial sum storage circuits, denoted S1 to S4. The respective input terminals of each of the partial sum storage circuits (S1 to S4) are coupled to corresponding output terminals of a demultiplex arrangement DEMUX. The input terminal of demultiplex arrangement DEMUX is connected to the output terminal of the already mentioned adder ADD1.

The multiplex arrangement MUX2 and the demultiplex arrangement DEMUX are supplied at control input terminals with the binarily encoded amplitude values occurring at the output terminal of the already mentioned multiplex arrangement MUX1 in time division multiplex manner. These amplitude values function as address signals for the selection of the individual partial sum storage circuits S1 to S4.

The output terminals of the partial sum storage S1 to S4 are additionally coupled to a buffer FR. This buffer FR which may, for example, be constructed of AND elements, is controllable by the counter arrangement Z by the output of a control signal in such a way that, at the end of a counting period of the counter arrangement, the output terminals of the partial sum storage circuits S1 to S4 are connected simultaneously with a corresponding one of multipliers M1 to M4. The reference numbers here indicate a correspondence between the partial sum storage circuits S1 to S4 and multipliers M1 to M4, respectively. The multipliers M1 to M4 are, additionally, supplied with respective constants, denoted B1 to B4, respectively, which will be discussed below in still greater detail. The output signals of these multipliers are supplied to an adder ADD2 which forms the sum of these signals.

The previously mentioned partial sum storage circuits S1 to S4, in combination with the adder ADD1, form four individual accumulators whose use will be discussed below.

As already mentioned above, in operation, the circuit configuration shown in FIG. 1 functions for generating correction signals with which echo signals in a duplex transmission of multilevel data signals, in the present embodiment four-level data signals, are compensated. Such echo signals can be expressed, in known manner, by the following equation:

$$y_E(kT) = \sum_{n=0}^{N-1} A_{k-n} \cdot h_E(nT) \quad (1)$$

where $y_e(kT)$ indicates an echo signal at time kT, $A_{k-n}$ the instantaneous amplitude value of a data signal at time (k-n)T, $h_e(nT)$ the echo pulse response at time nT, and N the number of successive data signals supplying a component of an echo signal.

For compensating an echo signal formed according to equation (1) a correction signal of form:

$$y_K(kT) = \sum_{n=0}^{N-1} A_{k-n} \cdot C_n \quad (2)$$

is required. Where $y_k(kT)$ is the echo correction signal at time kT and $C_n$ represents correction signal coefficients. As is evident when comparing equations (1) and (2), complete compensation of an echo signal is possible if $C_n = h_e(nT)$.

From equation (2), a plurality of W partial sums can be formed as follows:

$$y_K = \quad (3)$$

$$A1 \sum_{n=0}^{N-1} d1(k-n) \cdot C_n + \ldots + AW \sum_{n=0}^{N-1} dW(k-n) \cdot C_n$$

where  $d1(k-n) = 1,$ if $A_{k-n} = A1$
       $= 0$ otherwise
       .
       .
       .
       $dW(k-n) = 1,$ if $A_{k-n} = AW$
       $= 0$ otherwise A1 to AW here represent the possible amplitude values of the data signals to be transmitted. According to equation (3) partial sums are formed from the correction signal coefficients to be taken into consideration for the individual amplitude values A1 to AW and multiplied by the particular amplitude value. A plurality of W partial correction signals result which are added to form a total correction signal.

By the circuit configuration shown in FIG. 1, correction signals according to equation (3) are generated. The assumption is made, as already mentioned, that the data signals to be transmitted in accordance with a "2B1Q" coding can assume four amplitude values, specifically $-1, -3, +1, +3$, and are transmitted at a transmission rate of 80 kBaud. Moreover, it may be assumed that 48 successive data signals supply components of an echo signal and, hence, must be taken into consideration for the formation of a correction signal.

Referring again to FIG. 1, the four-level data signals are accepted at an 80 kHz clock rate into the shift register arrangement SR. The contents of all of the stages of this shift register arrangement are retrieved within a time interval of 12.5 μs, corresponding to the selected transmission rate, by the multiplex arrangement MUX1 which, to this end, receives from the counter arrangement Z corresponding address signals. At the output terminal of this multiplex arrangement, hence, in the course of a retrieval cycle in time division multiplex manner, the binary encoded 48 amplitude values stored in the individual stages of the shift register arrangement SR occur successively.

The coefficient storage arrangement KSP is supplied with the address signals output by the counter arrangement Z, so that with each selection of a stage of the shift register arrangement SR a corresponding correction signal coefficient $C_n$ is made available. The 48 correction signal coefficients $C_n$, hence, occur successively at the output terminal of the coefficient storage arrangement KSP. Each correction signal coefficient $C_n$ is supplied to one of the four above-mentioned accumulators, selected in response to the amplitude value of the corresponding data signal to be transmitted. The accumulators form partial sums from the correction signal coefficients supplied to them. These accumulators are, as already mentioned above, formed by the combination of the partial sum storage S1 to S4 and the adder ADD1 common to all accumulators. The partial sum storage circuits are controllable by the counter arrangement Z in such a way that their storage contents are deleted at the beginning of a counting period of the counter arrangement.

The selection of the individual possible accumulators for the available correction signal coefficients $C_n$ is made in response to the amplitude values of the data signal to be transmitted, which are present, simultaneously with the correction signal coefficients $C_n$, at the output terminal of the multiplex arrangement MUX1. These amplitude values are supplied to the multiplex arrangement MUX2 and the demultiplex arrangement DEMUX as address signals. In response to this addressing, the particular selected partial sum storage circuit S1 to S4 supplies its partial sum stored in it up to this point to the adder ADD1 via the multiplex arrangement MUX2. The adder ADD1 adds the correction signal coefficient $C_n$ made available by the coefficient storage arrangement KSP to the that particular partial sum to form a new partial sum. Subsequently, the newly formed partial sum is replaced into the particular partial sum storage circuit S1 to S4 via the demultiplex arrangement DEMUX. In the process, the partial sum previously stored there is overwritten. After completion of a counting period of the counter arrangement Z, i.e. after all amplitude values stored in the 48 stages of the shift register arrangement SR have been processed, the buffer FR is enabled in response to a control signal output from the counter arrangement Z. The partial sums stored in the partial sum storages S1 to S4 are, thereby, supplied to the multipliers M1 to M4, respectively. These multipliers M1 to M4, correspond to respective accumulators and, hence, to respective amplitude values, and multiply the partial sum supplied to them by a constant B1 to B4, respectively, which corresponds to the particular amplitude value. In the illustrated embodiment, the constants B1 to B4 are, thus, fixed at $-1, -3, +1, +3$.

The signals occurring at the output terminals of the multipliers M1 to M4 represent partial correction signals according to equation (3) which are supplied to the adder ADD2 for the formation of a total correction signal $y_k$.

Up to now the assumption was made that the amplitude values of the data signals correspond to the nominal values $-1, -3, +1, +3$. However, the case may arise that deviations from the nominal value may occur at least with some of the amplitude values. Such deviations can be brought about, for example, by transmission devices participating in the transmission of data signals. Such deviations result in asymmetric echo signals.

In order to be able to compensate for such echo signals, the circuit configuration indicated in FIG. 1 can be expanded as shown in FIG. 2. In FIG. 2 only the multipliers M1 to M4 and the adder ADD2 succeeding it are shown. As is evident from FIG. 2 the partial correction signals occurring at the output terminals of the multipliers M1 to M4 are each supplied additionally to further multipliers M5 to M8, respectively. Each of these multipliers M5 to M8 is supplied additionally with an additional correction signal coefficient b1 to b4, respectively.

The corrected partial correction signals present at the output terminal of multipliers M5 to M8 are supplied, along with the partial correction signals output by multipliers M1 to M4, to the adder ADD2 for the formation of a total correction signal. Thus, the total correction signal obtained is:

$$y_K = \sum_{n=1}^{4} K_n + \sum_{n=1}^{4} b_n K_n \quad (4)$$

where $K_n$ represent the partial correction signals present at the output terminals of the multipliers M1 to M4.

The previously mentioned additional correction signal coefficients b1 to b4 can, for example, be adaptively settable. Such setting can take place, for example, in the form:

$$b_i(new) = b_i(old) + g \cdot D \cdot K_i \quad (5)$$

where $b_i$ indicates the particular additional correction signal coefficient to be set, g is a constant, $K_i$ is the partial correction signal assigned to the particular additional correction signal coefficient, and D is the difference between the just generated correction signal $y_k$ and a received data signal e corrected by it.

A circuit configuration suitable for such adaptive setting is illustrated in FIG. 3 using the additional correction signal coefficient b1 as example. Circuit configurations for additional correction signal coefficients b2 to b4 would be similar to that illustrated in FIG. 3. This circuit configuration has a subtractor SUB to which the just generated correction signal $y_x$ and the signal e are supplied. The output terminal of subtractor SUB is connected to a multiplier M9 which receives, in addition, the partial correction signal $K_n$, output by the multiplier M1. This output signal of this multiplier M9 is supplied to a further multiplier M10 which multiplies the signal supplied to it by the constant g. The product signal resulting therefrom is transmitted to an input terminal of an adder SUM. This adder is supplied at a second input terminal with the additional correction signal coefficient b1(old), which had been previously stored in a storage arrangement KR, for example a storage register. Thus, the updated additional correction signal coefficient b1(new) is present at the output terminal of the adder SUM. This updated value is replaced into storage arrangement KR by overwriting the additional correction signal coefficient b1(old) previously stored there. This new additional correction signal coefficient b1(new) is then supplied to the multiplier M5 for the formation of an additional correction signal.

It should be pointed out that the circuit configuration shown in detail in FIG. 3 can also be developed for the adaptive setting of the additional correction signal coefficients $b_n$. For updating the additional correction signal coefficient b1, the multiplier M9 does not receive the partial correction signal $K_n$ output by the multiplier M1 and the difference signal made available by the subtractor SUB. Instead, only the sign of the mentioned signals are supplied to the multiplier M9. In this case, the input terminals of the multiplier M9 are each preceded by circuit configurations for sign determination SGN1 and SGN2, respectively.

The circuit configuration represented in FIG. 1 can be simplified for the case that the amplitude values of the four-level level data signals to be transmitted are symmetrical with respect to sign. In this case, only the partial sums for the amplitude values $\pm 1$, $\pm 3$ need to be included. Such a circuit configuration requires only two partial sum storage circuits, and an arrangement which carries out either an addition or a subtraction depending upon the signs of the amplitude values present at the output terminal of the multiplex arrangement MUX1 in place of adder ADD1.

The number of multipliers M5 to M8 shown in FIG. 3 can also be reduced if only some of the amplitude values of the data signals to be transmitted deviate from the nominal values.

Above, the generation of correction signals during transmission of four-level data signals was explained in conjunction with FIGS. 1 to 3. The described circuit configuration can, however, also be adapted to the transmission of any multilevel data signals by providing a corresponding number of partial sum storage circuits and multipliers succeeding them. A microprocessor arrangement can also be used for the generation of correction signals according to equation (3), instead of the circuit configuration described with reference to FIGS. 1 to 3.

In conclusion, it should be pointed out that the method and the circuit configuration according to the present invention has been explained using the generation of correction signals for compensating echo signals as an example. The described method and the circuit configuration operating according to this method, however, are generally suitable for filter structures for generating filter coefficients. As an example, filter coefficients may be mentioned here which function in decision feedback distortion correctors to correct the distortion of received multi-level data signals.

What is claimed is:

1. A method for generating filter signals in a transversal filter, to which data signals assuming a plurality W of different amplitude values are supplied as input signals, said method comprising the steps of:

storing a plurality N of successive input signals in a serial-in-parallel-out storage arrangement having a plurality N of data signal storage cells;

adding predetermined filter signal coefficients corresponding to the input signals stored in the data signal storage cells individually for the W possible amplitude values and making available W corresponding partial sum signals;

multiplying the partial sum signals individually by a factor corresponding to the particular amplitude value to form product signals;

multiplying at least some of the product signals by an additional filter coefficient assigned to the particular amplitude value to form additional product signals; and adding the product signals and the additional product signals to form a filter signal.

2. The method of claim 1, further comprising the step of:

setting the additional filter signal coefficients adaptively upon the forming of a filter signal according to the product signal just present associated to this filter signal and a data signal corrected by the just formed filter signal.

3. A method for generating correction signals in a transmission equipment for a duplex transmission of data signals via a two-wire line, which data signals assume a plurality W of different amplitude values and which correction signals function for suppressing echo signals relating to transmit data signals delivered to said two-wire line and superimposed on receive data signals coupled from said two-wire line, said method comprising the steps of:

storing a plurality N of successive transmit data signals in a serial-in parallel-out storage arrangement having a plurality N of data signal storage cells;

adding predetermined correction signal coefficients corresponding to the transmit data signals stored in said data signal storage cells individually for the W possible amplitude values and making available W corresponding partial sum signals;

multiplying the partial sum signals individually by a factor corresponding to the particular amplitude value to form product signals;

multiplying at least some of the product signals by an additional correction signal coefficient assigned to the particular amplitude value to form additional product signals; and adding the product signals and the additional product signals to form a correction signal.

4. The method of claim 3, further comprising the step of:

setting the additional correction signal coefficients adaptively upon the forming of a correction signal according to the product signal just present associated to said additional correction signal and a receive data signal corrected by the just formed correction signal.

5. A transversal filter for generating filter signals, to which data signals assuming a plurality W of different amplitude values are supplied as input signals, said transversal filter comprising:

a serial-in-parallel-out storage arrangement having a plurality of N data signal storage cells for storing N successive data signals;

a coefficient storage arrangement having a plurality of N coefficient storage cells for storing filter signal coefficients assigned to the N data signal storage cells;

polling means connected to the serial-in-parallel-out storage arrangement and the coefficient storage arrangement for polling the data signal storage cells together with the coefficient storage cells;

an accumulator arrangement with a plurality W of accumulators, each of which is assigned to one of the possible W amplitude values of said data signals and is individually selectable according to the data signals stored in the data signal storage cells at the polling of the data signal storage cells and the coefficient storage cells, thereby adding only the filter signal coefficients provided by the coefficient storage arrangement for the particular amplitude value and making available a corresponding partial sum signal;

a multiplier arrangement with a plurality W of first multipliers, each of which is coupled to one of the accumulators for multiplying the partial sums signal supplied to it by a factor corresponding to the particular amplitude value and makes available a product signal resulting therefrom;

a plurality of second multipliers succeeding at least some of the first multipliers for multiplying the product signal supplied to the particular second multiplier by an additional filter signal coefficient assigned to the particular amplitude value to form an additional product signal; and an adder responsive to the product signals and additional product signals made available by the first and second multipliers which adder adds these product signals and additional product signals to form a filter signal.

6. The transversal filter of claim 5, wherein said serial-in-parallel-out storage arrangement comprises a shift register arrangement with N stages for storing the amplitude values of said data signals in a binary encoded form, wherein in the course of a polling cycle said polling means access the N stages for calling up the particular stored amplitude values successively and said coefficient storage arrangement for calling up the filter signal coefficients assigned by the particular stages:

wherein upon the calling up of an amplitude value in conjunction with a filter signal coefficient the accumulator of said accumulator arrangement assigned to the particular amplitude value is activated for accepting the particular filter signal coefficient to form a partial sum signal;

and wherein buffer means responsive to a control signal output by said polling means and indicating the end of a polling cycle are connected with said accumulator arrangement which buffer means output the partial sum signals formed by said accumulator arrangement to said first multipliers only at the end of a polling cycle.

7. The transversal filter of claim 5, wherein said accumulator arrangement comprises a plurality of individual partial sum storage circuits for storing said partial sum signals;

a multiplex arrangement connected at its input side with output terminals of the individual partial sum storage circuits and controlled by said amplitude values called up in the course of a polling cycle for selectively providing the partial sum signals stored in the individual partial sum storage circuits at an output terminal;

an adder connected at its input side with the output terminal of the multiplex arrangement and said coefficient storage arrangement for adding the filter signal coefficient called up from the coefficient storage arrangement and the partial sum signal just provided by the multiplex arrangement and providing a changed partial sum signal at its output terminal and a demultiplex arrangement connected at its input terminal with the output terminal of the adder and at its output terminals with input terminals of the individual partial sum storage circuits and controlled by said amplitude values called up in the course of a polling cycle for storing the changed partial sum signals provided by the adder in the individual partial sum storage circuits.

8. The transversal filter of claim 5, further comprising:
one or more control devices, corresponding to the number of said second multipliers, for adaptively setting of the particular additional filter signal coefficient, each of the control devices is responsive to the product signal supplied to the particular second multiplier and to a data signal corrected by the just formed filter signal for calculating and supplying an additional filter signal coefficient in dependence upon the additional filter signal coefficient previously supplied to the particular second multiplier.

9. A transversal filter for generating filter signals, which is supplied with four-level binary encoded data signals of whose two possible amplitude values are symmetrical to a predetermined reference value and differ only with respect to sign, comprising:
a serial-in-parallel-out storage arrangement having a plurality of N data signal storage cells for storing N successive data signals;
a coefficient storage arrangement having a plurality of N coefficient storage cells for storing filter signal coefficients assigned to the N data signal storage cells;
polling means connected to the serial-in-parallel-out storage arrangement and the coefficient storage arrangement for polling the data signal storage cells together with the coefficient storage cells;
an accumulator arrangement with two accumulators, each of which is assigned to one of said possible two amplitude values deviating from each other with respect to magnitude and which is individually selectable according to the data signals stored in the data signal storage cells at the polling of the data signal storage cells and the coefficient storage cells, thereby, dependent upon the sign information contained in the binary encoded data signals, accumulating only the filter signal coefficients provided by the coefficient storage arrangement for the particular amplitude value and making available a corresponding partial sum signal;
a multiplier arrangement including two first multipliers, each of which is coupled to one of the accumulators for multiplying the partial sum signal supplied to it by a factor corresponding to the particular amplitude value and makes available a product signal resulting therefrom;
a second multiplier succeeding one of said first multipliers for multiplying the product signal supplied to the second multiplier by an additional filter signal coefficient assigned to the particular amplitude value to form an additional product signal; and
an adder responsive to the product signals and the additional product signal made available by the first and second multipliers which adder adds these product signals and additional product signal to form a filter signal.

10. The transversal filter of claim 9, wherein said accumulator arrangement comprises two individual partial sums storage circuits for storing said partial sum signals;
a multiplex arrangement connected at its input side with output terminals of the individual partial sum storage circuits and controlled by said amplitude values called up in the course of a polling cycle for selectively providing the partial sum signals stored in the two partial sum storage circuits at an output terminal;
an arithmetic arrangement at its input side with the output terminal of the multiplex arrangement and said coefficient storage arrangement for adding the filter signal coefficient called up from the coefficient storage arrangement and the partial sum signal just provided by the multiplex arrangement or for subtracting the filter signal coefficient called up from the coefficient storage arrangement from the partial sum signal just provided by the multiplex arrangement in dependence upon said sign information contained in the data signal just called up by said polling means and providing a changed partial sum signal at its output terminal and a demultiplex arrangement connected at its input terminal with the output terminal of the adder and at its output terminals with input terminals of the individual partial sum storage circuits and controlled by said amplitude values called up in the course of a polling cycle for storing the changed partial sum signals provided by the adder in the individual partial sum storage circuits.

* * * * *